United States Patent
Tan

(10) Patent No.: US 11,791,351 B2
(45) Date of Patent: Oct. 17, 2023

(54) ARRAY SUBSTRATE AND MANUFACTURING METHOD THEREOF

(71) Applicant: TCL CHINA STAR OPTOELECTRONICS TECHNOLOGY CO., LTD., Shenzhen (CN)

(72) Inventor: Zhiwei Tan, Shenzhen (CN)

( * ) Notice: Subject to any disclaimer, the term of this patent is extended or adjusted under 35 U.S.C. 154(b) by 468 days.

(21) Appl. No.: 17/045,186

(22) PCT Filed: Jun. 5, 2020

(86) PCT No.: PCT/CN2020/094686
§ 371 (c)(1),
(2) Date: Oct. 5, 2020

(87) PCT Pub. No.: WO2021/208215
PCT Pub. Date: Oct. 21, 2021

(65) Prior Publication Data
US 2023/0122931 A1 Apr. 20, 2023

(30) Foreign Application Priority Data
Apr. 13, 2020 (CN) .......................... 202010286731.2

(51) Int. Cl.
*H01L 21/00* (2006.01)
*H01L 27/00* (2006.01)
(Continued)

(52) U.S. Cl.
CPC ...... *H01L 27/1288* (2013.01); *H01L 21/3081* (2013.01); *H01L 21/30604* (2013.01);
(Continued)

(58) Field of Classification Search
CPC .......... H01L 21/30604; H01L 21/3081; H01L 21/32139; H01L 27/1288; H01L 27/1225;
(Continued)

(56) References Cited

U.S. PATENT DOCUMENTS 7,229,569 B1 * 6/2007 Seki .................. H01L 23/53238
257/E29.147
9,564,460 B1 2/2017 Xiong et al.
(Continued)

FOREIGN PATENT DOCUMENTS

CN 102315175 A 1/2012
CN 103295970 A 9/2013
(Continued)

*Primary Examiner* — Nikolay K Yushin

(57) ABSTRACT

The present disclosure provides an array substrate and a manufacturing method of the array substrate. In the manufacturing method of the array substrate, during performing a first wet etching and a second wet etching on a second metal layer, the wet etching is stopped when a copper conductive layer is merely etched completely. Because a wet etching speed of a liner layer is slow, an etching time of the wet etching and a CD loss of the copper conductive layer can be greatly reduced, and the CD loss is relatively small. Meanwhile, an entire CD loss of the second metal layer can be reduced, and an aperture ratio can be improved.

20 Claims, 5 Drawing Sheets

(51) Int. Cl.
   *H01L 29/00*     (2006.01)
   *H01L 27/12*     (2006.01)
   *H01L 21/306*    (2006.01)
   *H01L 21/308*    (2006.01)
   *H01L 21/3213*   (2006.01)
   *H01L 29/786*    (2006.01)

(52) U.S. Cl.
   CPC .... *H01L 21/32139* (2013.01); *H01L 27/1225* (2013.01); *H01L 29/7869* (2013.01)

(58) Field of Classification Search
   CPC ... H01L 27/124; H01L 27/06; H01L 27/1248; H01L 29/7869; H01L 29/24; H01L 29/7864; H01L 29/458; H01L 29/66765
   See application file for complete search history.

(56) References Cited

U.S. PATENT DOCUMENTS

| | | | |
|---|---|---|---|
| 10,727,256 B2* | 7/2020 | Ge | ............... H01L 21/02592 |
| 2003/0178656 A1 | 9/2003 | Kwon et al. | |
| 2004/0041958 A1 | 3/2004 | Hwang et al. | |
| 2016/0254296 A1 | 9/2016 | Liu et al. | |
| 2020/0135767 A1* | 4/2020 | Ge | ............... H01L 29/66765 |

FOREIGN PATENT DOCUMENTS

| | | | |
|---|---|---|---|
| CN | 105047723 A | 11/2015 | |
| CN | 110112071 A | 8/2019 | |

* cited by examiner

ARRAY SUBSTRATE AND MANUFACTURING METHOD THEREOF

FIELD OF INVENTION

The present disclosure relates to the field of display technologies, and particularly relates to an array substrate and a manufacturing method of the array substrate.

BACKGROUND OF INVENTION

Thin film transistor liquid crystal displays (TFT-LCDs) occupy a leading position in a current flat panel display market due to their small sizes, low power consumption, and no radiation. At present, 4-mask process is widely used in industry and has a significant effect of saving processes.

With continuous upgrade of requirements for panels, 8K display panels have become a main direction for development of large-size panels. With improvement of resolution and sizes, a copper manufacturing process not only becomes a necessary technology, but also makes a copper thickness increasingly thicker. A structure made by the copper manufacturing process is generally composed of a copper conductive layer and a liner layer (generally molybdenum or titanium). Due to a slow etching speed of the liner layer in a conventional etching solution system, it is necessary to extend etching time after the copper conductive layer is etched completely, so as to completely etch the liner layer and prevent metal residue. However, this way leads to an excessively large critical dimension loss (CD loss) of the copper conductive layer, and the large CD loss causes a line width of a metal layer to be set too large, resulting in a low aperture ratio of the 8K display panels and a substantial increase in energy consumption.

In addition, because the metal layer needs to undergo two wet etching treatments, the 4-mask process has a larger CD loss of the metal layer, resulting in a greater loss of the aperture ratio, and thus applications of the 4-mask process in the 8K display panels are limited.

In summary, a new array substrate and a manufacturing method of the array substrate need to be provided to solve the above technical problems.

Technical Problems

An array substrate and a manufacturing method of the array substrate provided in the present disclosure solve technical problems that due to a slow etching speed of a liner layer in a conventional etching solution system, a CD loss of a copper conductive layer is too large, which results in a low aperture ratio.

Technical Solutions

In order to solve the above problems, the present disclosure provides technical solutions as followings:

An embodiment of the present disclosure provides a manufacturing method of an array substrate, including following steps:

S10: providing a substrate, and sequentially laminating a first metal layer, an insulating layer, an amorphous silicon layer, an ohmic contact layer, a second metal layer, and a photoresist layer on the substrate, wherein the second metal layer includes a liner layer and a copper conductive layer sequentially laminated on the ohmic contact layer;

S20: using the photoresist layer as a shielding layer and performing a first wet etching treatment on the copper conductive layer to expose a part of the liner layer;

S30: using the photoresist layer as the shielding layer and performing a first dry etching treatment on the liner layer, the ohmic contact layer, and the amorphous silicon layer;

S40: performing an ashing treatment on the photoresist layer positioned in a first region to expose a part of the copper conductive layer, and performing a second wet etching treatment on the copper conductive layer to expose the liner layer positioned in the first region, wherein a gas used in the ashing treatment is oxygen;

S50: using the photoresist layer as the shielding layer and performing a second dry etching treatment on the liner layer and the ohmic contact layer to form an active layer, a source electrode, a drain electrode, and a channel positioned between the source electrode and the drain electrode; and S60: peeling off the photoresist layer.

According to the manufacturing method of the array substrate provided in an embodiment of the present disclosure, in the step S20 and the step S40, time periods for performing the first wet etching treatment and the second wet etching treatment on the copper conductive layer range between 50 seconds and 60 seconds respectively, and a material of the liner layer includes molybdenum.

According to the manufacturing method of the array substrate provided in an embodiment of the present disclosure, in the step S20 and the step S40, an etching solution used in the first wet etching treatment and the second wet etching treatment on the copper conductive layer is a hydrogen peroxide solution, and a material of the liner layer includes titanium or molybdenum titanium alloy.

According to the manufacturing method of the array substrate provided in an embodiment of the present disclosure, in the step S30, an etching gas used in the first dry etching treatment on the liner layer, the ohmic contact layer, and the amorphous silicon layer includes a gaseous mixture containing sulfur hexafluoride and chlorine.

According to the manufacturing method of the array substrate provided in an embodiment of the present disclosure, a mixing ratio of the sulfur hexafluoride and the chlorine is 1:10.

According to the manufacturing method of the array substrate provided in an embodiment of the present disclosure, an edge of the source electrode and an edge of the drain electrode are flush with an edge of the liner layer.

According to the manufacturing method of the array substrate provided in an embodiment of the present disclosure, the first metal layer includes gate electrodes and signal lines arranged at intervals from the gate electrodes.

According to the manufacturing method of the array substrate provided in an embodiment of the present disclosure, the photoresist layer is formed by a positive photoresist.

An embodiment of the present disclosure provides a manufacturing method of an array substrate, including following steps:

S10: providing a substrate, and sequentially laminating a first metal layer, an insulating layer, an amorphous silicon layer, an ohmic contact layer, a second metal layer, and a photoresist layer on the substrate, wherein the second metal layer includes a liner layer and a copper conductive layer sequentially laminated on the ohmic contact layer;

S20: using the photoresist layer as a shielding layer and performing a first wet etching treatment on the copper conductive layer to expose a part of the liner layer;

S30: using the photoresist layer as the shielding layer and performing a first dry etching treatment on the liner layer, the ohmic contact layer, and the amorphous silicon layer;

S40: performing an ashing treatment on the photoresist layer positioned in a first region to expose a part of the copper conductive layer, and performing a second wet etching treatment on the copper conductive layer to expose the liner layer positioned in the first region;

S50: using the photoresist layer as the shielding layer and performing a second dry etching treatment on the liner layer and the ohmic contact layer to form an active layer, a source electrode, a drain electrode, and a channel positioned between the source electrode and the drain electrode; and S60: peeling off the photoresist layer.

According to the manufacturing method of the array substrate provided in an embodiment of the present disclosure, in the step S20 and the step S40, time periods for performing the first wet etching treatment and the second wet etching treatment on the copper conductive layer range between 50 seconds and 60 seconds respectively, and a material of the liner layer includes molybdenum.

According to the manufacturing method of the array substrate provided in an embodiment of the present disclosure, in the step S20 and the step S40, an etching solution used in the first wet etching treatment and the second wet etching treatment on the copper conductive layer is a hydrogen peroxide solution, and a material of the liner layer includes titanium or molybdenum titanium alloy.

According to the manufacturing method of the array substrate provided in an embodiment of the present disclosure, in the step S30, an etching gas used in the first dry etching treatment on the liner layer, the ohmic contact layer, and the amorphous silicon layer includes a gaseous mixture containing sulfur hexafluoride and chlorine.

According to the manufacturing method of the array substrate provided in an embodiment of the present disclosure, a mixing ratio of the sulfur hexafluoride and the chlorine is 1:10.

According to the manufacturing method of the array substrate provided in an embodiment of the present disclosure, an edge of the source electrode and an edge of the drain electrode are flush with an edge of the liner layer.

According to the manufacturing method of the array substrate provided in an embodiment of the present disclosure, the first metal layer includes gate electrodes and signal lines arranged at intervals from the gate electrodes.

According to the manufacturing method of the array substrate provided in an embodiment of the present disclosure, the photoresist layer is formed by a positive photoresist.

According to the manufacturing method of the array substrate provided in an embodiment of the present disclosure, a material of the first metal layer includes molybdenum, aluminum, aluminum-nickel alloy, molybdenum-tungsten alloy, chromium, or copper, or a combination of above metals.

According to the manufacturing method of the array substrate provided in an embodiment of the present disclosure, a material of the insulating layer is one of silicon nitride, silicon oxide, and silicon oxynitride.

An embodiment of the present disclosure provides the array substrate, manufactured by the above manufacturing method of the array substrate, including:

the substrate;

the first metal layer disposed on the substrate;

the insulating layer disposed on the first metal layer;

the amorphous silicon layer disposed on the insulating layer;

the ohmic contact layer disposed on the amorphous silicon layer;

the liner layer disposed on the ohmic contact layer; and the source electrode and the drain electrode disposed on the liner layer, wherein the channel is arranged between the source electrode and the drain electrode, materials of the source electrode and the drain electrode consist of the copper conductive layer, and an edge of the source electrode and an edge of the drain electrode are flush with an edge of the liner layer.

According to the array substrate provided in an embodiment of the present disclosure, a material of the liner layer is one of molybdenum, titanium, and molybdenum titanium alloy.

Beneficial Effects

Beneficial effects of the present disclosure are: in the array substrate and the manufacturing method of the array substrate provided in the present disclosure, during a traditional 4-mask process, when the first wet etching and the second wet etching are performed on the second metal layer, the wet etching is stopped after the copper conductive layer is merely etched completely. At this time, the liner layer is retained completely. Because a wet etching speed of the liner layer is slow, the etching time of the wet etching and the CD loss can be greatly reduced, and the CD loss is smaller. Meanwhile, etching steps to the liner layer are added in a conventional dry etching process, so an entire CD loss of the second metal layer can be reduced to reduce a CD loss of metals and improve the aperture ratio.

DESCRIPTION OF DRAWINGS

The accompanying drawings to be used in the description of embodiments of the present disclosure or prior art will be described in brief to more clearly illustrate the technical solutions of the embodiments or the prior art. The accompanying drawings described below are only part of the embodiments of the present disclosure. For those of ordinary skill in the art, other drawings can be obtained from these drawings without creative work.

DETAILED DESCRIPTION OF EMBODIMENTS

Figure 1:
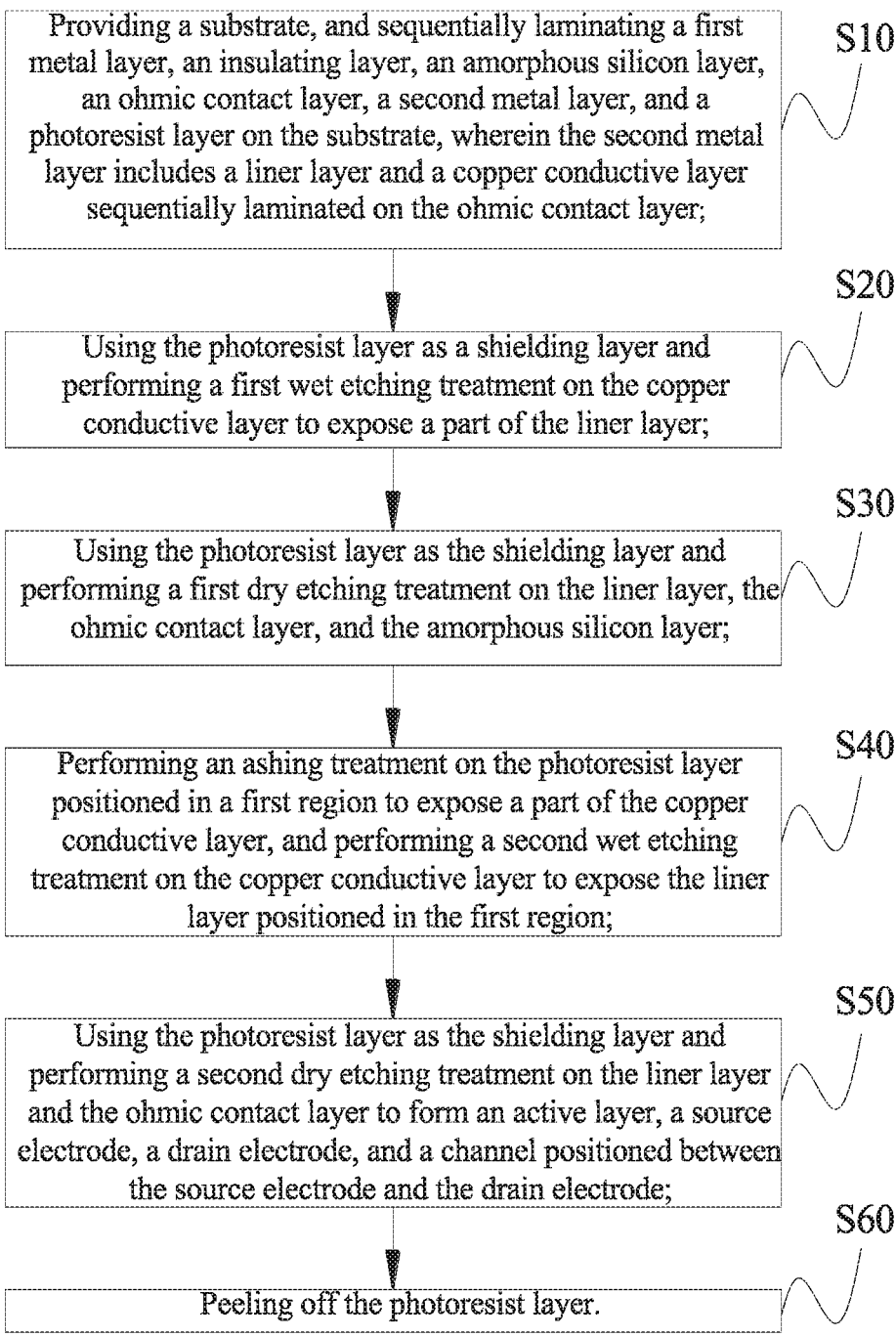
FIG. 1 is a flow chart of a manufacturing method of an array substrate provided by an embodiment of the present disclosure.

The following description of the various embodiments is provided to illustrate the specific embodiments. Directional terms described by the present disclosure, such as "top", "bottom", "front", "back", "left", "right", "inner", "outer", "side", "vertical", "level", etc., are only directions by referring to the accompanying drawings, and thus the used terms are used only for the purpose of describing embodiments of the present disclosure and are not intended to be limiting of the present disclosure. In the drawings, units with similar structures are labeled with the same reference number.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first", "second", and "third" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrated connection. It can mean a mechanical connection, an electrical connection, or can communicate with each other. It can mean a direct connection, an indirect connection by an intermediate, or an inner communication or an interaction between two elements. Those skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The present disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

The present disclosure is directed towards the array substrate and the manufacturing method of the array substrate provided in the prior art. Since the etching speed of the liner layer under the conventional etching solution system is relatively slow, the CD loss of the copper conductive layer is too large, which in turn leads to a low aperture ratio. The embodiments of the present disclosure can solve this defect.

As shown in FIG. 1, an embodiment of the present disclosure provides a manufacturing method of an array substrate, including following steps:

S10: providing a substrate 10, and sequentially laminating a first metal layer 20, an insulating layer 30, an amorphous silicon layer 40, an ohmic contact layer 50, a second metal layer 60, and a photoresist layer 70 on the substrate 10, wherein the second metal layer 60 includes a liner layer 601 and a copper conductive layer 602 sequentially laminated on the ohmic contact layer 50.

Figure 2A:
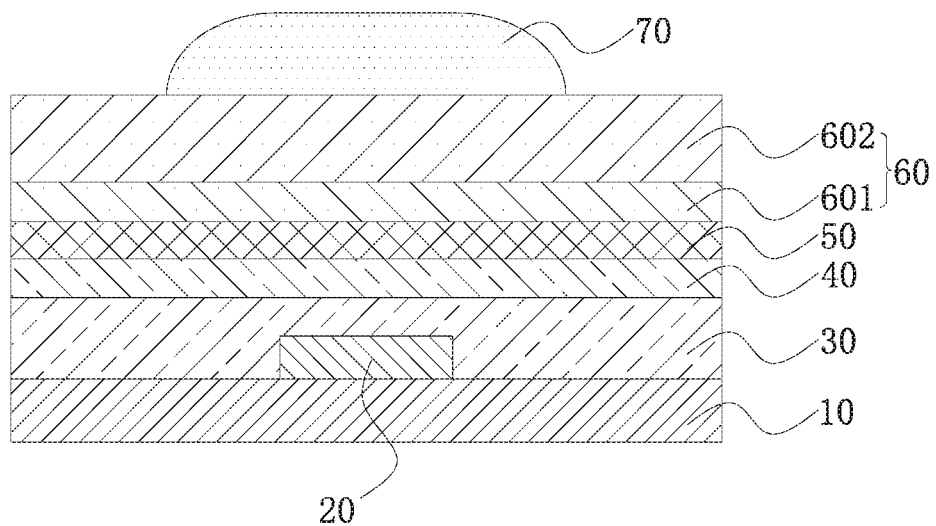
FIG. 2A-FIG. 2G are schematic views during a process of the manufacturing method of the array substrate provided by an embodiment of the present disclosure.

Specifically, as shown in FIG. 2A, the above film layers may be sequentially formed on the substrate 10 by deposition, sputtering, or coating. A raw material of the substrate 10 may be one of a glass substrate, a quartz substrate, and a resin substrate, etc. The first metal layer 20 is disposed on the substrate 10, and a material of the first metal layer 20 may be made of molybdenum, aluminum, aluminum nickel alloy, molybdenum tungsten alloy, chromium, or copper, or a combination of the above metals. The first metal layer 20 is treated by means of a yellow light process to form gate electrodes and signal lines arranged at intervals from the gate electrodes. The signal lines include scanning lines providing scanning signals for thin film transistors. The insulating layer covers the first metal layer 20 and the substrate 10, and a material of the insulating layer 30 is one of silicon nitride, silicon oxide, and silicon oxynitride. The amorphous silicon layer 40 covers the insulating layer 30 to form an active layer. The ohmic contact layer 50 covers the amorphous silicon layer 40 to prevent the second metal layer 60 from directly contacting with the amorphous silicon layer 40.

The second metal layer 60 covers the ohmic contact layer 50, and the second metal layer 60 includes the liner layer 601 and the copper conductive layer 602 sequentially laminated on the ohmic contact layer 50. Wherein, the copper conductive layer 602 is used to form a source electrode 6021 and a drain electrode 6022 of the array substrate. Because copper particles in the copper conductive layer 602 are prone to diffuse into the ohmic contact layer 50 and the amorphous silicon layer 40 under the copper conductive layer 602, which affects conductive characteristics of the copper conductive layer 602, the liner layer 601 is arranged between the copper conductive layer 602 and the ohmic contact layer 50.

S20: using the photoresist layer 70 as a shielding layer and performing a first wet etching treatment on the copper conductive layer 602 to expose a part of the liner layer 601.

Figure 2B:
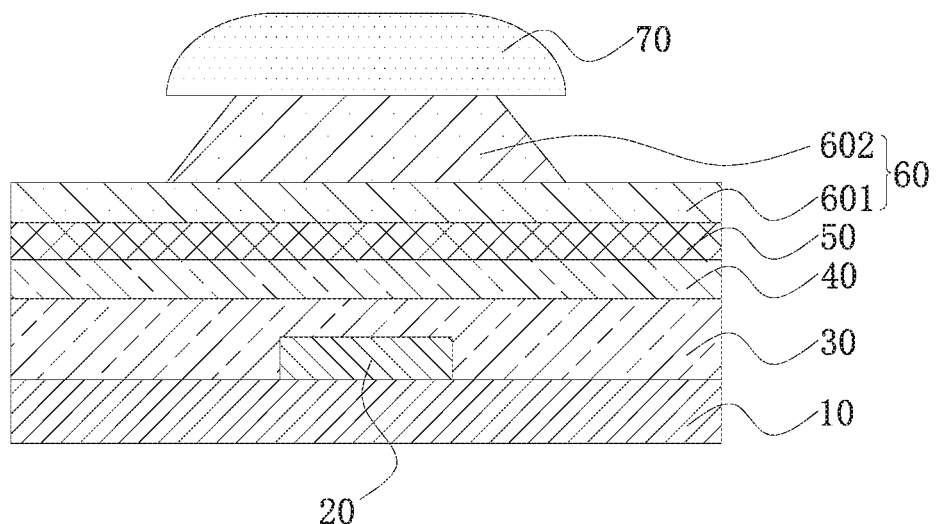

Specifically, as shown in FIG. 2B, because an etching speed of the copper conductive layer 602 is faster than an etching speed of the liner layer 601, in the embodiment of the present disclosure, a wet etching treatment is firstly performed on the copper conductive layer 602, and after the copper conductive layer 602 is completely etched, the liner layer 601 still remains intact due to its slow etching speed or no etching, thereby preventing a CD loss of the copper conductive layer 602 from being too large and leading to a low aperture ratio when the etching of the copper conductive layer 601 is completed.

Furthermore, a material of the liner layer 601 includes molybdenum, titanium, or molybdenum titanium alloy. Above-mentioned purposes can be achieved by selecting a matching etching solution or controlling an etching time according to the material of the liner layer 601.

For example, when the material of the liner layer 601 is molybdenum, the etching solution selected for the first wet etching treatment may be a copper acid etching solution. By controlling time periods for performing the first wet etching treatment and the second wet etching treatment on the copper conductive layer 602 range between 50 seconds and 60 seconds respectively, during the period, the copper conductive layer 602 has been etched completely, while the liner layer is hardly etched due to the slow etching speed. Compared with an etching time ranging between 120 seconds and 130 seconds for the first wet etching in the prior art, this method can reduce the etching time of the wet etching greatly.

As another example, when the material of the liner layer 601 is molybdenum titanium alloy, the etching solution selected for performing the first wet etching treatment and the second wet etching treatment on the copper conductive layer 602 may be a hydrogen peroxide solution. Because the titanium or the molybdenum titanium alloy hardly reacts with the hydrogen peroxide solution, when the copper conductive layer 602 is etched, the liner layer 601 is also not etched.

S30: using the photoresist layer 70 as the shielding layer and performing a first dry etching treatment on the liner layer 601, the ohmic contact layer 50, and the amorphous silicon layer 40.

Figure 2C:
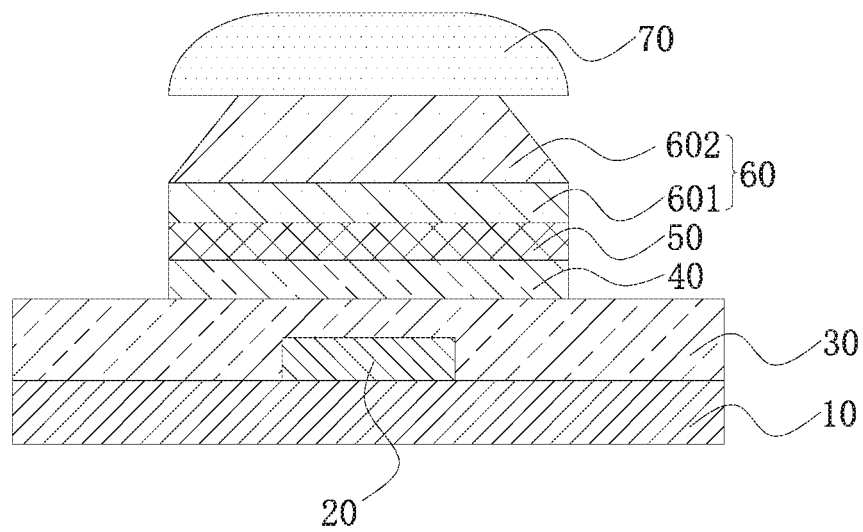

As shown in FIG. 2C, after the copper conductive layer 602 in the step S20 is etched completely, the first dry etching treatment is performed on the liner layer 601. That is to say, in a conventional dry etching process, an additional step for etching the liner layer 601 added can reduce an entire CD loss of the second metal layer 60, so as to reduce the CD loss of the metals and improve the aperture ratio. At the same time, in the embodiment of the present disclosure, the liner layer 601, the ohmic contact layer 50, and the amorphous silicon layer 40 may be etched by a same dry etching treatment. And because above-mentioned processes are performed in a chamber of the same machine, no additional engineering sites are added, which improves production efficiency.

Furthermore, an etching gas used in the first dry etching treatment on the liner layer 601, the ohmic contact layer 50, and the amorphous silicon layer 40 includes a gaseous mixture containing sulfur hexafluoride and chlorine. Good etching effects may be obtained by using the gaseous mixture.

Preferably, in the gaseous mixture, a mixing ratio of the sulfur hexafluoride and the chlorine is 1:10.

S40: performing an ashing treatment on the photoresist layer positioned in a first region 100 to expose a part of the copper conductive layer 602, and performing a second wet etching treatment on the copper conductive layer 602 to expose the liner layer 601 positioned in the first region 100.

Figure 2D:
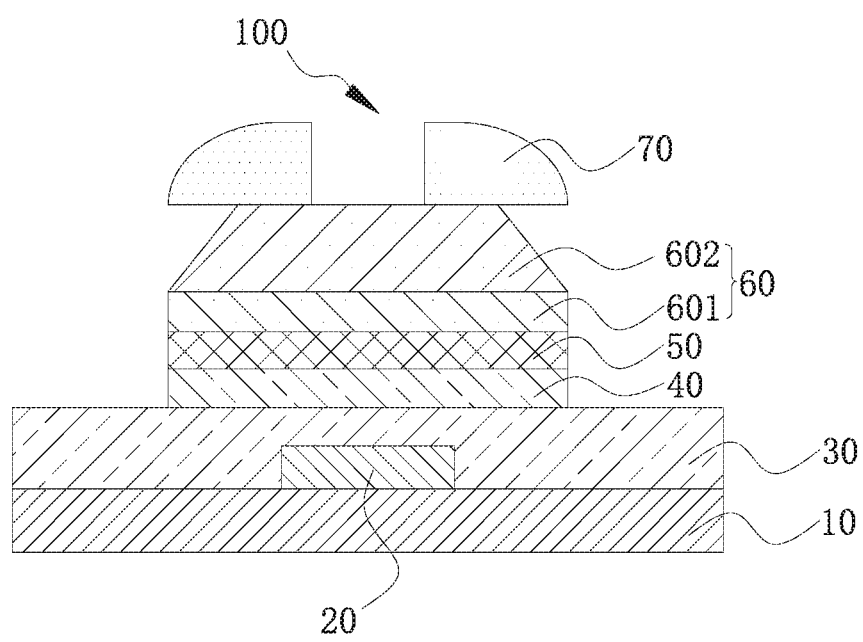

Specifically, as shown in FIG. 2D, the ashing treatment is performed on the photoresist layer 70 positioned in the first region 100 to reduce a thickness of the photoresist layer 70 in the first region 100 or remove the photoresist layer 70 in the first region 100 completely, so as to expose the copper conductive layer 602 in the first region 100 and to make preparations for subsequent second wet etching treatment on the copper conductive layer 602.

Figure 2E:
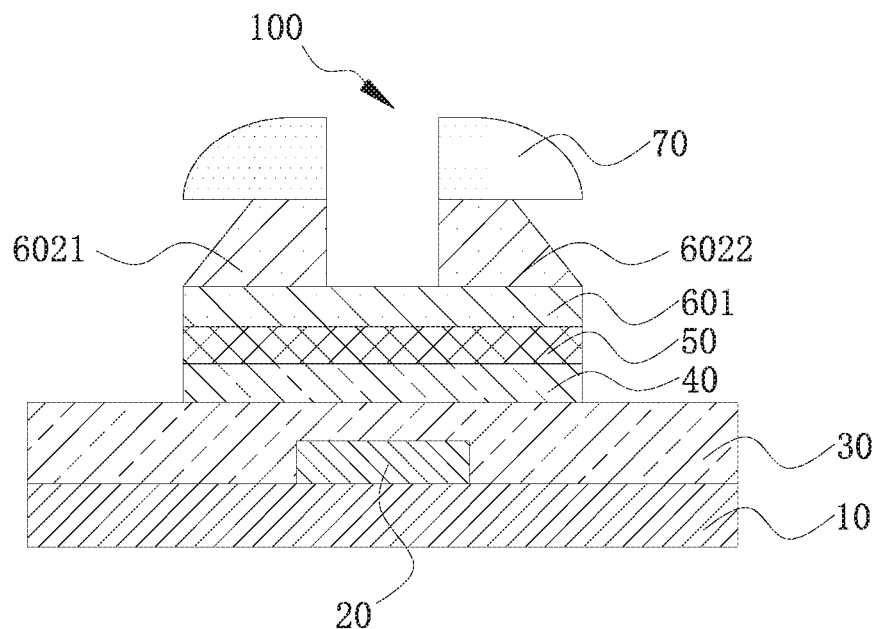

As shown in FIG. 2E, the copper conductive layer 602 positioned at the first region 100 is etched to form the source electrode 6021 and the drain electrode 6022. Wherein the photoresist layer 70 is formed by a positive photoresist. A gas used in the ashing treatment is oxygen.

It should be noted that, principles of the second wet etching treatment for the copper conductive layer 602 in the step S40 are the same as principles of the first wet etching treatment for the copper conductive layer 602 in the step S20. For details, please refer to above related descriptions of the step S20 in the embodiment of the present disclosure, which will not be repeated herein.

S50: using the photoresist layer 70 as the shielding layer and performing a second dry etching treatment on the liner layer 601 and the ohmic contact layer 50 to form an active layer, a source electrode 6021, a drain electrode 6022, and a channel positioned between the source electrode 6021 and the drain electrode 6022.

Figure 2F:
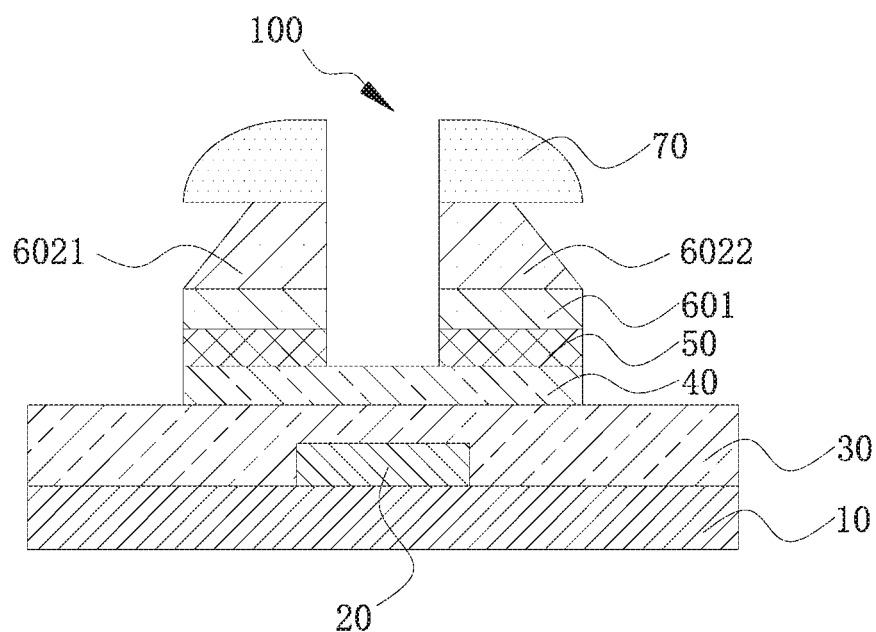

Specifically, as shown in FIG. 2F, in the first region 100, an edge of the source electrode 6021 and an edge of the drain electrode 6022 are flush with an edge of the liner layer 601 to guarantee the aperture ratio.

Similarly, principles of the second dry etching treatment for the liner layer 601 and the ohmic contact layer 50 in the step S50 are the same as principles of the first dry etching treatment for the liner layer 601, the ohmic contact layer 50, and the amorphous silicon layer 40 in the step S30. For details, please refer to above related descriptions of the step S30 in the embodiment of the present disclosure, which will not be repeated herein.

S60: peeling off the photoresist layer 70.

Figure 2G:
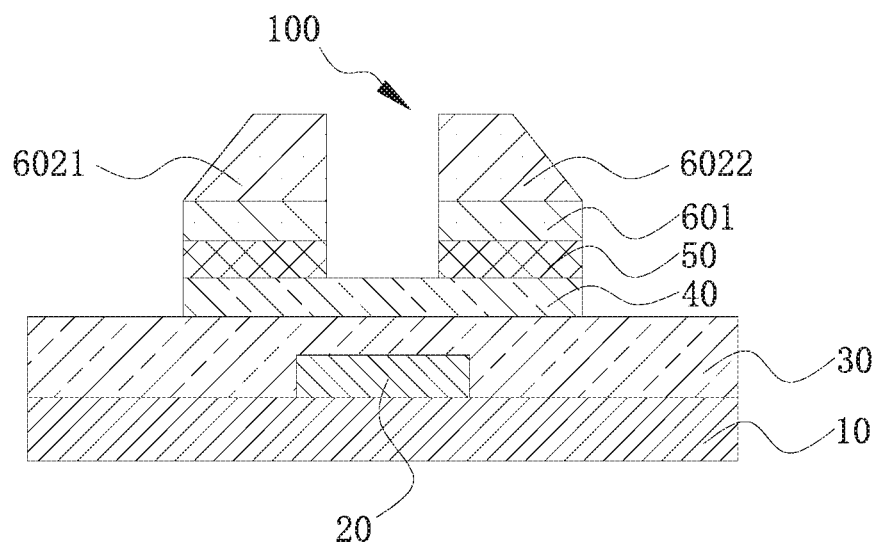

Specifically, as shown in FIG. 2G, the photoresist layer 70 is peeled off from the second metal layer 60, and then subsequent film layers are manufactured, such as pixel electrodes, etc. When the array substrate is a color filter on array (COA) substrate, a color resistance layer and a black matrix layer, etc. may further be manufactured.

Figure 3:
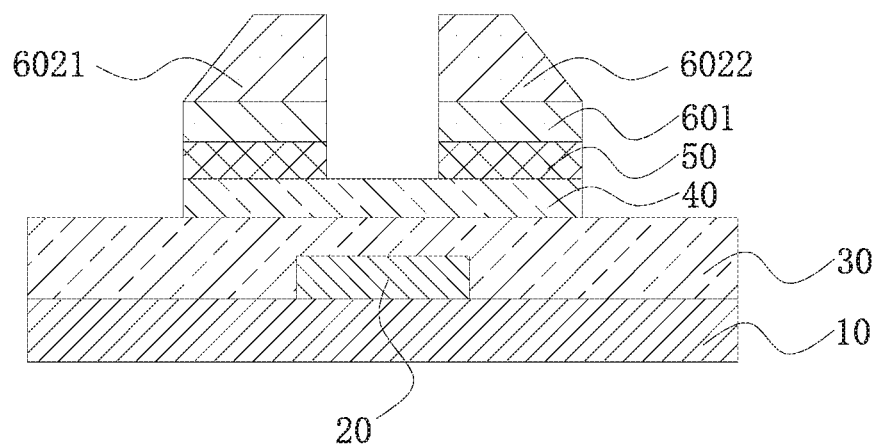
FIG. 3 is a sectional schematic view of the array substrate provided by an embodiment of the present disclosure.

As shown in FIG. 3, an array substrate provided by an embodiment of the present disclosure is manufactured by the above manufacturing method. The array substrate includes a substrate 10, a first metal layer 20 disposed on the substrate 10, an insulating layer 30 disposed on the first metal layer 20, an amorphous silicon layer 40 disposed on the insulating layer 30, an ohmic contact layer 50 disposed on the amorphous silicon layer 40, a liner layer 601 disposed on the ohmic contact layer 50, and a source electrode 6021 and a drain electrode 6022 disposed on the liner layer 601.

Specifically, the first metal layer 20 includes gate electrodes and signal lines arranged at intervals from the gate electrodes. Material of the source electrode 6021 and the drain electrode 6022 consist of a copper conductive layer 602. A material of the liner layer 601 is one of molybdenum, titanium, and molybdenum titanium alloy. An edge of the source electrode 6021 and an edge of the drain electrode 6022 are flush with an edge of the liner layer 601, which can reduce the CD loss of the copper conductive layer 602 greatly and guarantee an aperture ratio.

The beneficial effects of the present disclosure are: in the array substrate and the manufacturing method of the array substrate provided in the present disclosure, during a traditional 4-mask process, when the first wet etching and the second wet etching are performed on the second metal layer, the wet etching is stopped after the copper conductive layer is merely etched completely. At this time, the liner layer is retained completely. Because a wet etching speed of the liner layer is slow, the etching time of the wet etching and the CD loss can be greatly reduced, and the CD loss is smaller. Meanwhile, etching steps to the liner layer are added in a conventional dry etching process, so an entire CD loss of the second metal layer can be reduced to reduce a CD loss of metals and improve the aperture ratio.

In summary, although the present disclosure has been disclosed as above with preferred embodiments, the above preferred embodiments are not intended to limit the present invention. Those of ordinary skill in the art can make various changes and retouching without departing from the spirit and scope of the present disclosure. Therefore, a protection scope of the present disclosure is subject to a scope defined by the claims.

What is claimed is:

1. A manufacturing method of an array substrate, comprising following steps:
    S10: providing a substrate, and sequentially laminating a first metal layer, an insulating layer, an amorphous silicon layer, an ohmic contact layer, a second metal layer, and a photoresist layer on the substrate, wherein the second metal layer comprises a liner layer and a copper conductive layer sequentially laminated on the ohmic contact layer;
    S20: using the photoresist layer as a shielding layer and performing a first wet etching treatment on the copper conductive layer to expose a part of the liner layer, wherein an etching speed of the copper conductive layer is faster than an etching speed of the liner layer, the copper conductive layer is firstly etched, when the copper conductive layer is completely etched, the liner layer still remains intact;
    S30: using the photoresist layer as the shielding layer and performing a first dry etching treatment on the liner layer, the ohmic contact layer, and the amorphous silicon layer;
    S40: performing an ashing treatment on the photoresist layer positioned in a first region to expose a part of the copper conductive layer, and performing a second wet etching treatment on the copper conductive layer to expose the liner layer positioned in the first region, wherein a gas used in the ashing treatment is oxygen;
    S50: using the photoresist layer as the shielding layer and performing a second dry etching treatment on the liner layer and the ohmic contact layer to form an active layer, a source electrode, a drain electrode, and a channel positioned between the source electrode and the drain electrode; and
    S60: peeling off the photoresist layer.

2. The manufacturing method of the array substrate in claim 1, wherein in the step S20 and the step S40, time periods for performing the first wet etching treatment and the second wet etching treatment on the copper conductive layer range between 50 seconds and 60 seconds respectively, and a material of the liner layer comprises molybdenum.

3. The manufacturing method of the array substrate in claim 1, wherein in the step S20 and the step S40, an etching solution used in the first wet etching treatment and the second wet etching treatment on the copper conductive layer is a hydrogen peroxide solution, and a material of the liner layer comprises titanium or molybdenum titanium alloy.

4. The manufacturing method of the array substrate in claim 1, wherein an edge of the source electrode and an edge of the drain electrode are flush with an edge of the liner layer.

5. The manufacturing method of the array substrate in claim 1, wherein the first metal layer comprises gate electrodes and signal lines arranged at intervals from the gate electrodes.

6. The manufacturing method of the array substrate in claim 1, wherein the photoresist layer is formed by a positive photoresist.

7. The manufacturing method of the array substrate in claim 1, wherein in the step S30, an etching gas used in the first dry etching treatment on the liner layer, the ohmic contact layer, and the amorphous silicon layer comprises a gaseous mixture containing sulfur hexafluoride and chlorine.

8. The manufacturing method of the array substrate in claim 7, wherein a mixing ratio of the sulfur hexafluoride and the chlorine is 1:10.

9. A manufacturing method of an array substrate, comprising following steps:
    S10: providing a substrate, and sequentially laminating a first metal layer, an insulating layer, an amorphous silicon layer, an ohmic contact layer, a second metal layer, and a photoresist layer on the substrate, wherein the second metal layer comprises a liner layer and a copper conductive layer sequentially laminated on the ohmic contact layer;
    S20: using the photoresist layer as a shielding layer and performing a first wet etching treatment on the copper conductive layer to expose a part of the liner layer, wherein an etching speed of the copper conductive layer is faster than an etching speed of the liner layer, the copper conductive layer is firstly etched, when the copper conductive layer is completely etched, the liner layer still remains intact;
    S30: using the photoresist layer as the shielding layer and performing a first dry etching treatment on the liner layer, the ohmic contact layer, and the amorphous silicon layer;
    S40: performing an ashing treatment on the photoresist layer positioned in a first region to expose a part of the copper conductive layer, and performing a second wet etching treatment on the copper conductive layer to expose the liner layer positioned in the first region;
    S50: using the photoresist layer as the shielding layer and performing a second dry etching treatment on the liner layer and the ohmic contact layer to form an active layer, a source electrode, a drain electrode, and a channel positioned between the source electrode and the drain electrode; and
    S60: peeling off the photoresist layer.

10. The manufacturing method of the array substrate in claim 9, wherein in the step S20 and the step S40, time periods for performing the first wet etching treatment and the second wet etching treatment on the copper conductive layer range between 50 seconds and 60 seconds respectively, and a material of the liner layer comprises molybdenum.

11. The manufacturing method of the array substrate in claim 9, wherein in the step S20 and the step S40, an etching solution used in the first wet etching treatment and the second wet etching treatment on the copper conductive layer is a hydrogen peroxide solution, and a material of the liner layer comprises titanium or molybdenum titanium alloy.

12. The manufacturing method of the array substrate in claim 9, wherein an edge of the source electrode and an edge of the drain electrode are flush with an edge of the liner layer.

13. The manufacturing method of the array substrate in claim 9, wherein the first metal layer comprises gate electrodes and signal lines arranged at intervals from the gate electrodes.

14. The manufacturing method of the array substrate in claim 9, wherein the photoresist layer is formed by a positive photoresist.

15. The manufacturing method of the array substrate in claim 9, wherein a material of the first metal layer comprises molybdenum, aluminum, aluminum-nickel alloy, molybdenum-tungsten alloy, chromium, or copper, or a combination of above metals.

16. The manufacturing method of the array substrate in claim 9, wherein a material of the insulating layer is one of silicon nitride, silicon oxide, and silicon oxynitride.

17. The manufacturing method of the array substrate in claim 9, wherein in the step S30, an etching gas used in the first dry etching treatment on the liner layer, the ohmic contact layer, and the amorphous silicon layer comprises a gaseous mixture containing sulfur hexafluoride and chlorine.

18. The manufacturing method of the array substrate in claim 17, wherein a mixing ratio of the sulfur hexafluoride and the chlorine is 1:10.

19. The array substrate, comprising:
the substrate;
the first metal layer disposed on the substrate;
the insulating layer disposed on the first metal layer;
the amorphous silicon layer disposed on the insulating layer;
the ohmic contact layer disposed on the amorphous silicon layer;
the liner layer disposed on the ohmic contact layer; and
the source electrode and the drain electrode disposed on the liner layer, wherein the channel is arranged between the source electrode and the drain electrode, materials of the source electrode and the drain electrode consist of a copper conductive layer, and an edge of the source electrode and an edge of the drain electrode are flush with an edge of the liner layer,
the edge of the liner layer is flush with an edge of the ohmic contact layer and the amorphous silicon layer.

20. The array substrate in claim 19, wherein a material of the liner layer is one of molybdenum, titanium, and molybdenum titanium alloy.

* * * * *